(12) United States Patent
Kwon et al.

(10) Patent No.: US 9,472,583 B2
(45) Date of Patent: Oct. 18, 2016

(54) METHOD OF MANUFACTURING DISPLAY APPARATUS USING ETCHING BUFFER LAYER

(71) Applicant: Samsung Display Co., Ltd., Yongin, Gyeonggi-do (KR)

(72) Inventors: Seok Il Kwon, Suwon-si (KR); Deuk Jong Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/455,812

(22) Filed: Aug. 8, 2014

(65) Prior Publication Data

US 2015/0147837 A1  May 28, 2015

(30) Foreign Application Priority Data

Nov. 28, 2013  (KR) .......................... 10-2013-0146154

(51) Int. Cl.
| | |
|---|---|
| *H01L 27/12* | (2006.01) |
| *H01L 21/02* | (2006.01) |
| *H01L 21/311* | (2006.01) |
| *H01L 21/3213* | (2006.01) |

(52) U.S. Cl.
CPC ..... *H01L 27/1259* (2013.01); *H01L 21/02063* (2013.01); *H01L 21/31144* (2013.01); *H01L 21/32134* (2013.01)

(58) Field of Classification Search
None
See application file for complete search history.

(56) References Cited

U.S. PATENT DOCUMENTS

2003/0141811 A1\* 7/2003 Park .................... H01L 27/1255
                                                         313/506
2007/0037352 A1\* 2/2007 Suzawa et al. ............... 438/282

FOREIGN PATENT DOCUMENTS

| KR | 1998-038845 A | 8/1998 |
|---|---|---|
| KR | 10-2004-0001741 A | 1/2004 |
| KR | 10-2009-0032892 A | 4/2009 |
| KR | 10-2011-0050122 A | 5/2011 |

\* cited by examiner

*Primary Examiner* — Mohammad Islam
*Assistant Examiner* — Mikka Liu
(74) *Attorney, Agent, or Firm* — Lewis Roca Rothgerber Christie LLP

(57) ABSTRACT

A method of manufacturing a display device including providing a substrate, forming a semiconductor layer on the substrate, forming a first insulating layer on the semiconductor layer, forming a metal layer on the first insulating layer, forming a second insulating layer on the metal layer, forming an etching buffer layer on the second insulating layer, forming a photosensitive film pattern on the etching buffer layer, and etching the etching buffer layer and the first and second insulating layers to expose the semiconductor layer.

20 Claims, 13 Drawing Sheets

METHOD OF MANUFACTURING DISPLAY APPARATUS USING ETCHING BUFFER LAYER

CROSS-REFERENCE TO RELATED APPLICATION

This application claims priority to and the benefit of Korean Patent Application No. 10-2013-0146154 filed in the Korean Intellectual Property Office on Nov. 28, 2013, the entire content of which is incorporated herein by reference.

BACKGROUND

1. Field

The present invention relates to a method of manufacturing a display apparatus.

2. Description of the Related Art

Currently popular display apparatuses include a liquid crystal display (LCD), a plasma display panel (PDP), an organic light emitting display (OLED), a field effect display (FED), and an electrophoretic display (EPD).

Particularly, the OLED device includes two electrodes and an organic emission layer disposed therebetween. Electrons from one electrode and holes from the other electrode are combined in the organic emission layer to thereby generate excitons, which release energy to emit light.

Since the organic light emitting diode display has a self-luminance characteristic a separate light source is not required, and unlike a liquid crystal display, thickness and weight thereof may be reduced. Further, since the organic light emitting diode display exhibits high quality characteristics such as low power consumption, high luminance, and rapid response speed, the organic light emitting diode display is receiving attention as a next generation display device.

Such an organic light emitting display device is formed by sequentially stacking a semiconductor layer, a plurality of insulating layers, and a plurality of metal layers on a substrate. Then, a contact hole may be formed to expose the semiconductor layer by etching the insulating layer and a metal layer, and the semiconductor layer may be brought into contact with a source electrode and a drain electrode through the contact hole.

A large number of pixels are located within a restrictive space according to recent requirements of a high resolution display device. To that end, the width of the contact hole should be smaller.

However, if the width of the contact hole is smaller than a predetermined level as an etching process is applied to form the contact hole, some electrodes are exposed thereby generating a short-circuit or disconnection.

The above information disclosed in this Background section is only for enhancement of understanding of the background of the invention and therefore it may contain information that does not form the prior art that is already known to a person of ordinary skill in the art.

SUMMARY

The present invention has been made in an effort to provide a method of manufacturing a display device including forming fine contact holes of which a width is sufficiently small so as to not expose electrodes.

An exemplary embodiment provides a manufacturing method of a display device, including: providing a substrate; forming a semiconductor layer on the substrate; forming a first insulating layer on the semiconductor layer; forming a metal layer on the first insulating layer; forming a second insulating layer on the metal layer; forming an etching buffer layer on the second insulating layer; forming a photosensitive film pattern on the etching buffer layer; and etching the etching buffer layer and the first and second insulating layers to expose the semiconductor layer.

The etching buffer layer may contain Al or ITO.

A thickness of the etching buffer layer may be in a range of about 30 to about 50 nm.

The etching may include first etching the etching buffer layer to expose the second insulating layer, and second etching the first and second insulating layers to expose the semiconductor layer after exposing the second insulating layer.

A width of the second insulating layer exposed before the second etching is performed may be the same as the width of the semiconductor layer after the second etching is performed.

The width of the exposed semiconductor layer may be in a range of about 1.8 to about 2.1 μm.

The first etching may be performed as a wet etch.

The second etching may be performed as a dry etch.

The manufacturing method may further include removing the photosensitive film pattern, after the etching.

The manufacturing method may further include performing an annealing process, after the removing of the photosensitive film pattern.

The manufacturing method may further include removing the etching buffer layer, after the annealing process.

The removing of the etching buffer layer may be performed by using a buffered oxide etchant (BOE).

The insulating layer and the metal layer may be alternatively formed as a plurality of layers.

In accordance with the exemplary embodiment of the present invention, it is possible to prevent generation of a short-circuit or a disconnection caused by exposure of electrodes by forming fine contact holes.

DETAILED DESCRIPTION

Figure 1:
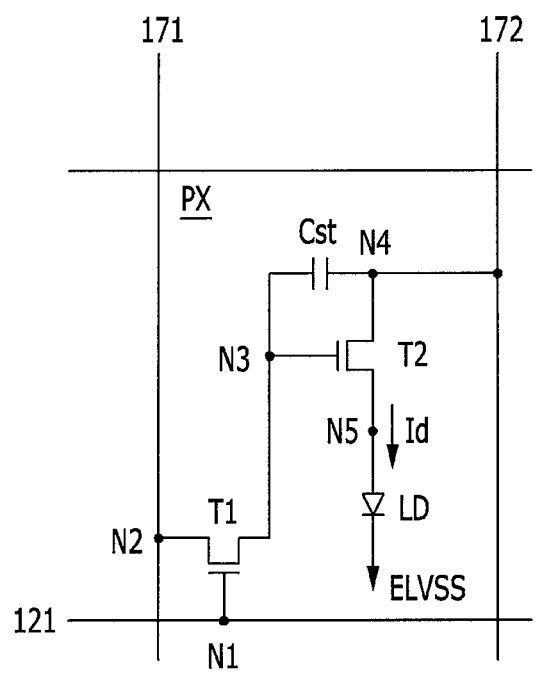
FIG. 1 is an equivalent circuit diagram illustrating a pixel of an organic light emitting display device.

Hereinafter, an exemplary embodiment of the present invention will be described in detail with reference to the attached drawings such that the present invention can be easily put into practice by those skilled in the art. As those skilled in the art would realize, the described embodiments may be modified in various different ways, all without departing from the spirit or scope of the present invention. On the contrary, exemplary embodiments introduced herein are provided to make the disclosed content thorough and complete, and sufficiently transfer the spirit of the present invention to those skilled in the art.

In the drawings, the thickness of layers, films, panels, regions, etc., are exaggerated for clarity. In addition, when a layer is described to be formed on another layer or on a substrate, this means that the layer may be formed on the other layer or on the substrate, or a third layer may be interposed between the layer and the other layer or the substrate. Like reference numerals refer to like elements throughout the specification.

FIG. 3 to FIG. 8 illustrate a manufacturing process according to a method of manufacturing a display device in accordance with an exemplary embodiment.

Referring to FIG. 3 to FIG. 8, the manufacturing method of the display device in accordance with the exemplary embodiment can form fine contact holes. Hereinafter, the description will be made by applying it to an organic light emitting display device in the exemplary embodiment. However, it is not limited thereto. Alternatively, the manufacturing method of the present exemplary embodiment may be applied to, e.g., a liquid crystal display (LCD), a plasma display panel (PDP), an electric field effect display (FED), and an electrophoretic display device (EPD).

First, a structure of the organic light emitting display device to which the manufacturing method in accordance with the present exemplary embodiment can be applied will be described with reference to FIG. 1 and FIG. 2.

FIG. 1 is an equivalent circuit diagram illustrating a pixel of the organic light emitting display device. FIG. 2 is a cross-sectional view illustrating the organic light emitting display device.

Referring to FIG. 1, an organic light emitting display device includes a plurality of signal lines 121, 171, and 172, and a pixel PX connected thereto. The pixel PX may be any one of a red pixel R, a green pixel G, and a blue pixel B.

The signal lines include a scanning signal line 121 for transmitting a gate signal (or a scan signal), a data line 171 for transmitting a data signal, and a driving voltage line 172 for transmitting a driving voltage. The scanning signal lines 121 are substantially extended in a row direction and are substantially parallel with each other, and the data lines 171 are substantially extended in a column direction and are substantially parallel with each other. The driving voltage lines 172 are shown to be substantially extended in a column direction, and they can be extended in the row direction or the column direction or formed as a mesh net.

One pixel PX includes thin film transistors including a switching transistor T1 and a driving transistor T2, a storage capacitor Cst, and an organic light emitting element LD. Although not shown in the drawing, the pixel PX may further include a thin film transistor and a capacitor so as to compensate the current supplied to the organic light emitting element.

The switching transistor T1 includes a control terminal N1, an input terminal N2, and an output terminal N3, and the control terminal N1 is connected to the scan signal line 121, the input terminal N2 is connected to the data line 171, and the output terminal N3 is connected to the driving transistor T2. The switching transistor T1 transmits the data signal provided by the data line 171 to the driving transistor T2 in response to the scan signal provided by the scan signal line 121.

The driving transistor T2 includes a control terminal N3, an input terminal N4, and an output terminal N5, and the control terminal N3 is connected to the switching transistor T1, the input terminal N4 is connected to the driving voltage line 172, and the output terminal N5 is connected to the organic light emitting element LD. The driving transistor T2 outputs an output current Id that is variable by a voltage between the control terminal N3 and the output terminal N5.

The capacitor Cst is connected between the control terminal N3 and the input terminal N4 of the driving transistor T2. The capacitor Cst charges the data signal applied to the control terminal N3 of the driving transistor T2 and maintains the charge when the switching transistor T1 is turned off.

The organic light emitting element LD is exemplarily an organic light emitting diode (OLED), and includes an anode connected to the output terminal N5 of the driving transistor T2 and a cathode connected to the voltage ELVSS. The organic light emitting element LD displays the image by emitting light with different intensities depending on the output current Id of the driving transistor T2.

The organic light emitting element LD can include an organic material for emitting one or at least one of primary colors (i.e., red, green and blue), and the organic light emitting device displays the desired image by a spatial sum of the colors.

The switching transistor T1 and the driving transistor T2 are n-channel field effect transistors (FETs), and at least one of them can be a p-channel field effect transistor. Also, the connection between the transistors T1 and T2, the capacitor Cst, and the organic light emitting element LD is changeable.

Hereinafter, the organic light emitting display device of the present exemplary embodiment will be described with reference to the cross-section thereof shown in FIG. 2.

Figure 2:
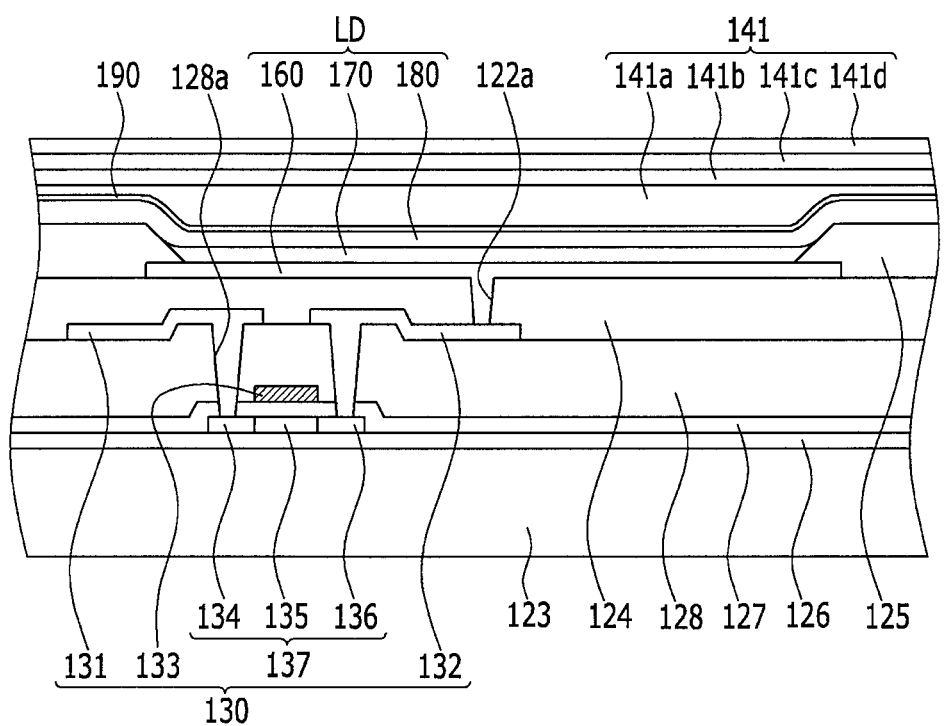
FIG. 2 is a cross-sectional view illustrating the organic light emitting display device.

Referring to FIG. 2, a substrate 123 is formed as an insulating substrate made of glass, quartz, ceramic, plastic, and the like. However, the present invention is not limited thereto, and the substrate 123 may also be formed as a metallic substrate made of stainless steel and the like.

A buffer layer 126 is formed on the substrate 123. The buffer layer 126 serves to prevent penetration of impure elements and planarize the surface of the substrate 123.

The buffer layer 126 may be formed of various materials capable of performing the above-mentioned functions. As an example, one of a silicon nitride (SiNx) layer, a silicon oxide (SiOx) layer, and a silicon oxynitride (SiOxNy) layer may be employed as the buffer layer 126. However, the buffer layer 126 does not have a necessary configuration, and may be omitted according to type and process conditions of the substrate 123.

A driving semiconductor layer 137 is formed on the buffer layer 126. The driving semiconductor layer 137 may be formed of a polysilicon film. The driving semiconductor layer 137 includes a channel region 135 in which impurities are not doped, and a source region 134 and a drain region 136 which are doped and are formed at opposite sides of the channel region 135. In this embodiment, an ionic material to be doped is a p-type impurity such as boron (B), and $B_2H_6$ is mainly used. In this case, the impurity may be changed according to a kind of the thin film transistor.

A gate insulating layer 127 formed of a silicon nitride (SiNx) or a silicon oxide (SiOx) is formed on the driving semiconductor layer 137. A gate wire including a driving gate electrode 133 is formed on the gate insulating layer 127. In addition, the driving gate electrode 133 is formed to overlap with at least a part of the driving semiconductor layer 137, particularly, the channel region 135.

An interlayer insulating layer 128 covering the driving gate electrode 133 is formed on the gate insulating layer 127. A contact hole 128a exposing the source region 134 and the drain region 136 of the driving semiconductor layer 137 is formed in the gate insulating layer 127 and the interlayer insulating layer 128. The interlayer insulating layer 128 may be formed by using a ceramic-series material such as a silicon nitride (SiNx), a silicon oxide (SiOx), or the like, similar to the gate insulating layer 127.

A data wire including a driving source electrode 131 and a driving drain electrode 132 is formed on the interlayer insulating layer 128. In addition, the driving source electrode 131 and the driving drain electrode 132 are respectively connected to the source region 134 and the drain region 136 of the driving semiconductor layer 137 via the contact hole 128a formed in the interlayer insulating layer 128 and the gate insulating layer 127.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the above-described examples, and may be variously changed into a known configuration which may be easily performed by those skilled in the art.

A planarization layer (e.g., film) 124 covering the data wire is formed on the interlayer insulating layer 128. The planarization layer 124 serves to planarize the interlayer insulating layer 128 by eliminating steps in order to increase the light emitting efficiency of the organic light emitting element to be formed thereon. In addition, the planarization layer 124 has an electrode contact hole 122a exposing a part of the drain electrode 132.

The planarization layer 124 may be made of at least one material of a polyacrylate resin, an epoxy resin, a phenolic resin, a polyamide resin, a polyimide resin, an unsaturated polyester resin, a polyphenylene ether resin, a polyphenylene sulfide resin, and a benzocyclobutene (BCB).

This exemplary embodiment is not limited to the above-described configuration, and one of the planarization layer 124 and the interlayer insulating layer 128 may be omitted in some cases.

A pixel electrode 160 serving as a first electrode of the organic light emitting element is formed on the planarization layer 124. In other words, the organic light emitting display device includes a plurality of pixel electrodes 160 respectively disposed for a plurality of pixels. Herein, the pixel electrodes 160 are separated from each other. Each of the pixel electrodes 160 is connected to the drain electrode 132 through the electrode contact hole 122a of the planarization layer 124.

Further, a pixel defining layer 125 having an opening that exposes the pixel electrode 160 is formed on the planarization layer 124. That is, the pixel defining layer 125 has a plurality of openings that are individually formed for each pixel. An organic emission layer 170 may be formed for each opening formed by the pixel defining layer 125. Accordingly, a pixel region in which each organic emission layer is formed may be defined by the pixel defining layer 125.

In this embodiment, the pixel electrode 160 is disposed so as to correspond to the opening of the pixel defining layer 125. However, the pixel electrode 160 is not necessarily disposed in the opening of the pixel defining layer 125. The pixel electrode 160 may be disposed beneath the pixel defining layer 125 in such a way so as to be partially overlapped by the pixel defining layer 125.

The pixel defining layer 125 may be made of a resin such as a polyacrylate resin, a polyimide resin, or the like, or a silica-series inorganic material.

Meanwhile, the organic emission layer 170 is formed on the pixel electrode 160.

Moreover, a common electrode 180 serving as a second electrode of the organic light emitting element may be formed on the organic emission layer 170. As such, the organic light emitting element LD including the pixel electrode 160, the organic emission layer 170, and the common electrode 180 is formed.

Each pixel electrode 160 and the common electrode 180 may be formed of a transparent conductive material, or a semi-transparent or reflective conductive material. The organic light emitting display device may be a top emission type, a bottom emission type, or a both-side emission type according to a kind of the material of the pixel electrode 160 and the common electrode 180.

A cover film 190 covering the common electrode 180 to protect it may be formed of an organic film on the common electrode 180.

Further, a thin film encapsulation layer 141 is formed on the cover layer 190. The thin film encapsulation layer 141 seals and protects the organic light emitting element LD and a driving circuit portion formed on the substrate 123 from the outside.

The thin film encapsulation layer 141 includes organic encapsulation layers 141a and 141c and inorganic encapsulation layers 141b and 141d alternately laminated one by one. FIG. 2 illustrates an embodiment where the two organic encapsulation layers 141a and 141c and the two inorganic encapsulation layers 141b and 141d are alternately stacked one by one to constitute the thin film encapsulation layer 141 as an example, but it is not limited thereto.

Hereinafter, the method of manufacturing the display device in accordance with the present exemplary embodiment will be described in detail with reference to FIG. 3 to FIG. 8.

Figure 3:
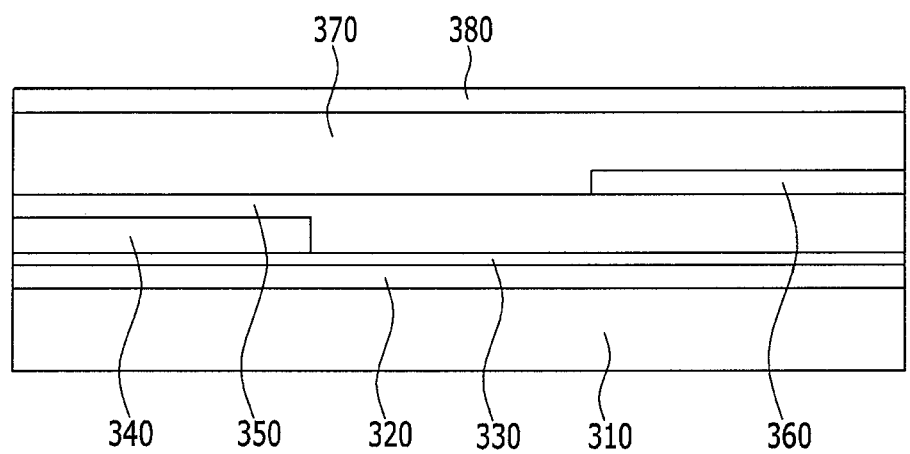
FIG. 3 to FIG. 8 illustrate a manufacturing process according to a method of manufacturing a display device in accordance with an exemplary embodiment.

Referring to FIG. 3, a semiconductor layer 320 is first formed on a substrate 310. Herein, the substrate 310 may correspond to the substrate 123 of FIG. 2.

In this embodiment, the semiconductor layer 320 may be formed of a polysilicon film as described above. The semiconductor layer 320 includes the channel region 135 in which impurities are not doped, and the source region 134 and the drain region 136 which are doped and formed at opposite sides of the channel region 135 as shown in FIG. 2.

A substrate buffer layer (not shown) may be formed between the substrate 310 and the semiconductor layer 320. However, the substrate buffer layer does not have a necessary configuration, and may be omitted according to type and process conditions of the substrate 310.

A first insulating layer 330 may be formed on the semiconductor layer 320. The first insulating layer 330 may be a single layer or multi-layer including at least one of tetraethyl orthosilicate (TEOS), a silicon nitride, and a silicon oxide. However, the material of the first insulating layer 330 is not limited thereto, and a well-known material that can be used for an insulating layer of the organic light emitting display device may be employed as the material of the first insulating layer 330.

In this embodiment, the first insulating layer 330 may be formed by using chemical vapor deposition, spin coating, or the like.

Next, a first metal layer 340 may be formed on the first insulating layer 330. In this embodiment, the first metal layer 340 is formed to cover a portion of the first insulating layer 330.

The first metal layer 340 may correspond to a gate wire which is formed in the organic light emitting display device.

The first metal layer 340 may be formed of a single layer or multiple layers made of Al, Ti, Mo, Cu, Ni, or an alloy thereof.

In this embodiment, the first metal layer 340 may be formed by using a vacuum deposition method. For example, the first metal layer 340 may be formed through a sputtering method of the vacuum deposition method.

Next, a second insulating layer 350 may be formed on the first insulating layer 330 to cover the first metal layer 340. Similar to the first insulating layer 330, the second insulating layer 350 may be a single layer or multi-layer including at least one of TEOS, a silicon nitride, and a silicon oxide.

A second metal layer 360 may be formed on the second insulating layer 350. As shown in FIG. 3, the second metal layer 360 is formed to cover a portion of the second insulating layer 250.

Similar to the first metal layer 340, the second metal layer 360 may correspond to a gate wire which is formed in the organic light emitting display device. A plurality of gate wires may be formed in the organic light emitting display device, and the first and second metal layers 340 and 360 may correspond to the gate wires.

Similarly, the second metal layer 360 may be formed of a single layer or multiple layers made of Al, Ti, Mo, Cu, Ni, or an alloy thereof. Similar to the first metal layer 340, the second metal layer 360 be formed by using a vacuum deposition method. For example, the second metal layer 360 may be formed through a sputtering method of the vacuum deposition method.

The first and second metal layers 340 and 360 are positioned to not overlap with each other. As shown in FIG. 3, the first and second metal layers 340 and 360 may be located separately from each other, and a contact hole to be described later may be formed to extend through the first and second metal layers 340 and 360.

Similarly, a third insulating layer 370 may be formed on the second insulating layer 350 to cover the second metal layer 360. Similar to the first and second insulating layers 330 and 350, the third insulating layer 370 may be a single layer or multi-layer including at least one of TEOS, a silicon nitride, and a silicon oxide.

In the method of manufacturing the display device in accordance with the present exemplary embodiment, the first to third insulating layers 330, 350, and 370 and the first and second metal layers 340 and 360 are stacked. However, this description is merely an example for explaining an operation in which a contact hole is formed by using the manufacturing method of the display device in accordance with the present exemplary embodiment. Stacking sequences and the stacked number of the insulating layers and metal layers may be varied without being limited thereto.

In the description related to the manufacturing method of the display device in accordance with the present exemplary embodiment, this contact hole may correspond to contact hole 128a shown in FIG. 2.

In the exemplary embodiment, an etching buffer layer 380 may be formed on the third insulating layer 370. The etching buffer layer 380 serves to prevent an increase in width of a contact hole in an etching process for forming the contact hole. This will be described later in detail.

The etching buffer layer 380 may be made of a material that can be removed by using a buffered oxide etchant (BOE) by which an etching buffer layer is removed after a wet etching process and an annealing process, which will be described later. For example, the etching buffer layer 380 may be made of aluminum (Al) or indium tin oxide (ITO).

Figure 10:
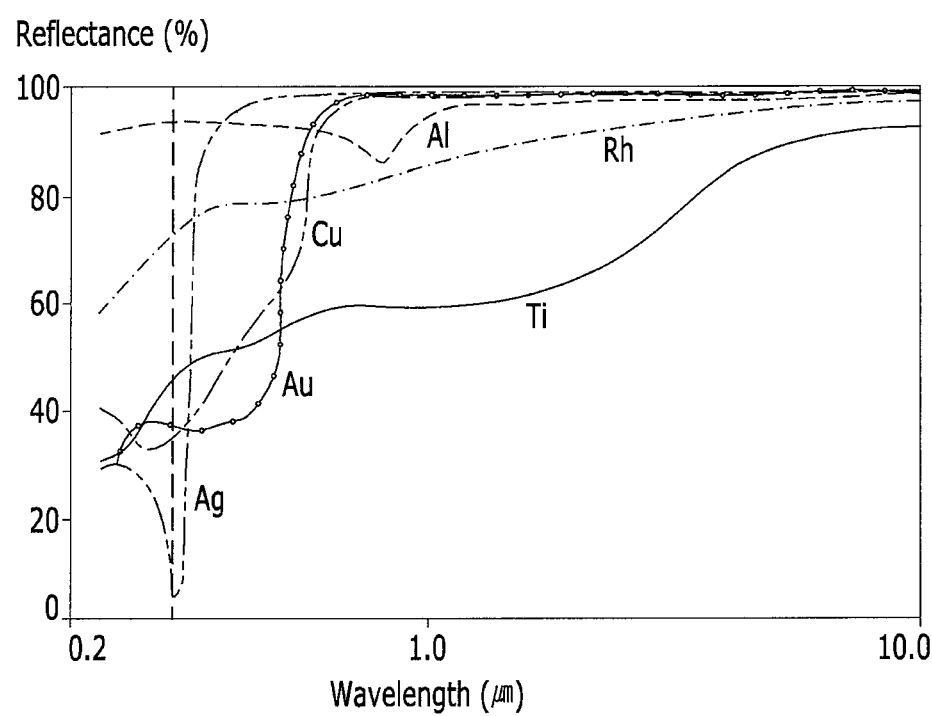
FIG. 10 is a graph illustrating a relationship between reflectivity and wavelength of a metal used in the manufacturing process in accordance with the present exemplary embodiment.

In the case that the etching buffer layer 380 is made of aluminum, a sufficient exposure amount can be obtained in an exposure operation in which a photosensitive film pattern is formed. As shown in FIG. 10, it is seen that aluminum has a higher reflectivity than that of other metals. When a metal layer located below the photosensitive film pattern has high reflectivity, light reflected from the metal layer may be increased.

The etching buffer layer 380 may have a thickness in a range of about 30 to about 50 nm. However, the thickness of the etching buffer layer 380 is not limited thereto, and may be varied depending on the width of a target contact hole to be formed.

Figure 4:
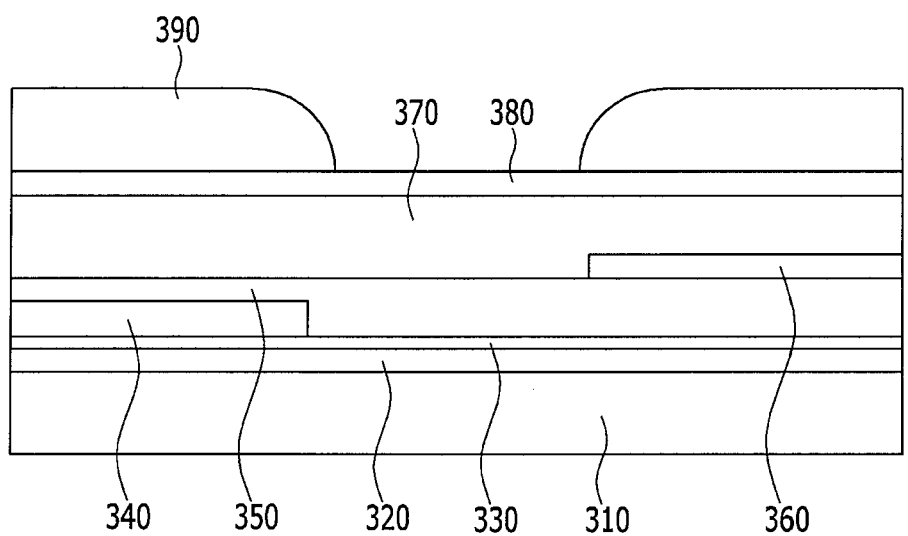

Next, as shown in FIG. 4, a photosensitive film pattern 390 is formed on an etching buffer layer 380. A plurality of openings may be formed in the photosensitive film pattern 390 to form a contact hole. This photosensitive film pattern 390 may be used as a mask when the contact hole is formed. Since the process for forming the photosensitive film pattern 390 may be performed by using a well-known method, no detailed description is provided.

Figure 5:
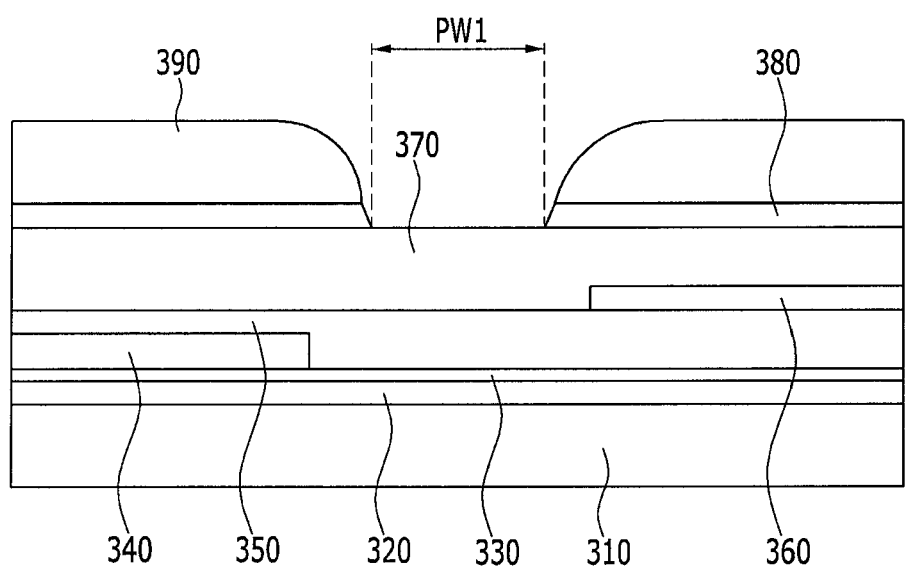

Next, as shown in FIG. 5, the etching buffer layer 380 is etched by using the photosensitive film pattern 390 as a mask to expose the third insulating layer 370. In this case, wet etching may be used when the etching buffer layer 380 is etched.

A width PW1 of the third insulating layer 370 exposed in the wet etching process may be in a range of about 1.8 to about 2.1 μm. However, the width PW1 of the exposed third insulating layer 370 may be varied depending on a width of a target contact hole to be formed, specifically a width CW of the semiconductor layer 320 which is exposed.

Figure 6:
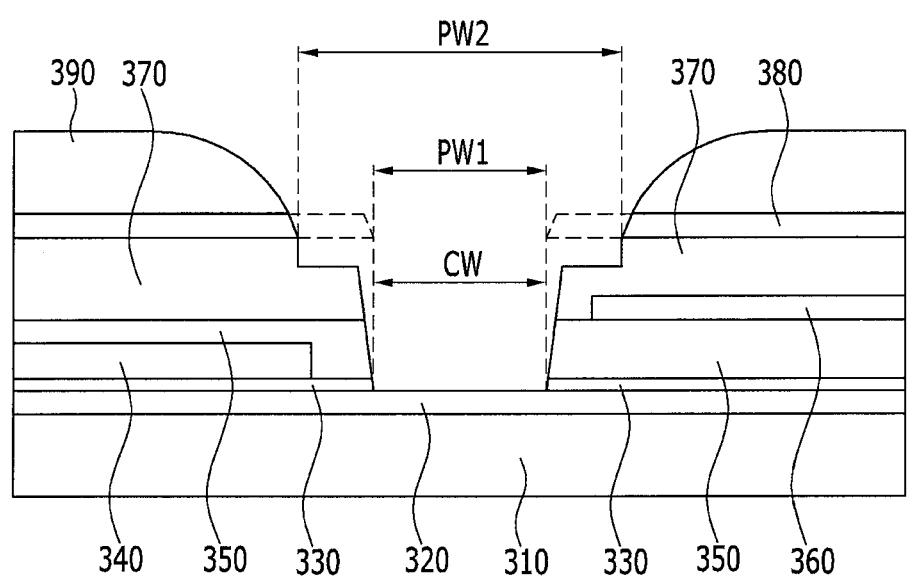

Referring to FIG. 6, after the third insulating layer 370 is exposed, the first to third insulating layers 330, 350, and 370 are etched to expose the semiconductor layer 320. Herein, dry etching may be used for etching the first to third insulating layers 330, 350, and 370.

The dry etching is performed, and then the width CW of the exposed semiconductor layer 320 is substantially the same as the width PW1 of the exposed third insulating layer 370. That is, the width CW of the exposed semiconductor layer 320 may be in a range of about 1.8 to about 2.1 μm.

When the first to third insulating layers 330, 350, and 370 are dry-etched to expose the semiconductor layer 320, the etching is performed as a width of the etching buffer layer 380 which increases from PW1 to PW2 as shown in FIG. 6. In this embodiment, the etching is performed as the widths of the first to third insulating layers 330, 350, and 370 become narrower from the upper side to the lower side.

Referring to FIG. 9A to FIG. 9D, how the width of the contact hole is changed is shown. As described above, the width PW2 of the third insulating layer L1, after the dry etching process, is larger than the width PW1 of the third insulating layer L1 exposed after the etching buffer layer 380 is etched. Further, in accordance with the present exemplary embodiment, it is seen that the width PW1 of the exposed third insulating layer L1 is substantially the same as the width CW of the exposed semiconductor layer L4. In FIGS. 9A-D, reference numerals L2 and L3 may be a plurality of insulating layers formed in the organic light emitting display device, and reference numeral L5 corresponds to the substrate.

Generally, when the dry etching is performed, the width of the upper side is increased to be larger than that of the lower side. Accordingly, if the etching buffer layer 380 is not provided, the width of the upper side is larger than that of the lower side as compared when the etching buffer layer 380 is provided. Further, as the width of the upper side becomes larger, the width of the lower side, i.e., the width of the exposed semiconductor layer 320, is also increased. Accordingly, it is difficult to form a fine contact hole required for a high resolution display device.

In addition, when the width thereof is increased, a metal layer, e.g., a gate electrode provided between the insulating layer, may be exposed. If the gate electrode is exposed, a short-circuit or disconnection may be generated.

In accordance with the present exemplary embodiment, it is possible to suppress the increase in the width of the upper side in the etching by using the etching buffer layer 380. As a result, it is possible to prevent the increase in the width of the lower side, i.e., the width of the exposed semiconductor layer 320. Therefore, the width of the exposed semiconductor layer 320 can be formed to such a fine level so as to be applicable to the high resolution display device.

Figure 7:
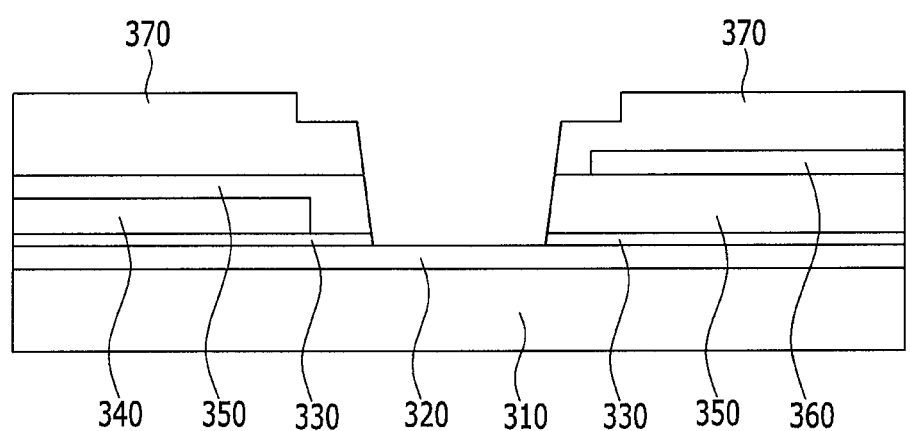

Next, referring to FIG. 7, the photosensitive film pattern 390 is removed after the etching process is completed. Herein, the photosensitive film pattern 390 is removed by using the well-known method such as ashing or an etchant.

Next, an annealing process may be performed after the photosensitive film pattern 390 is removed. The annealing process serves to stabilize the insulating layer or the metal layer provided in the display device. Since the annealing process is well known, no detailed description is provided.

Next, the etching buffer layer 380 is removed after the annealing process is performed. In this case, the etching buffer layer 380 is removed by using a BOE. That is, the etching buffer layer 380 is etched by the BOE to be removed.

In the meantime, when the annealing process is performed, polymers and the like may be formed on a sidewall of the contact hole. Herein, the polymers formed in the contact hole can be removed by using the BOE used for removing the etching buffer layer 380.

In other words, the polymers formed on the sidewall of the contact hole as well as the etching buffer layer 380 can be removed by using the BOE.

Figure 8:
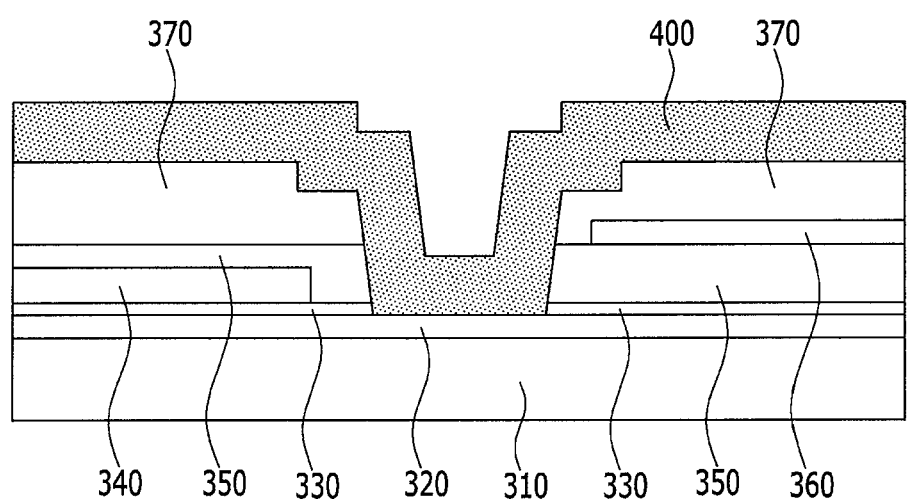
Figure 9A:
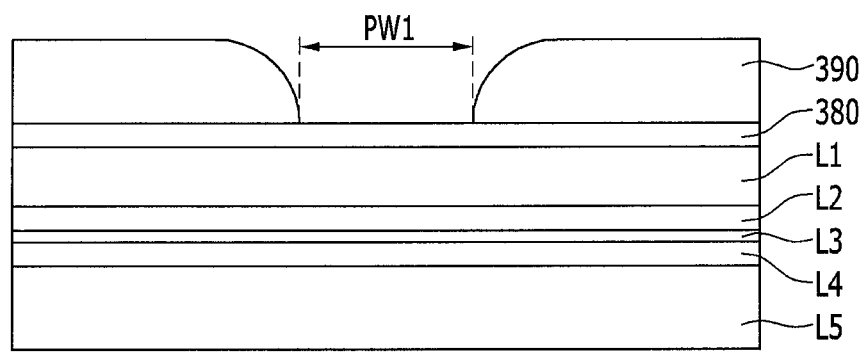
FIG. 9A to FIG. 9D illustrate how a width of a contact hole is changed in the manufacturing process in accordance with the present exemplary embodiment.
Figure 9B:
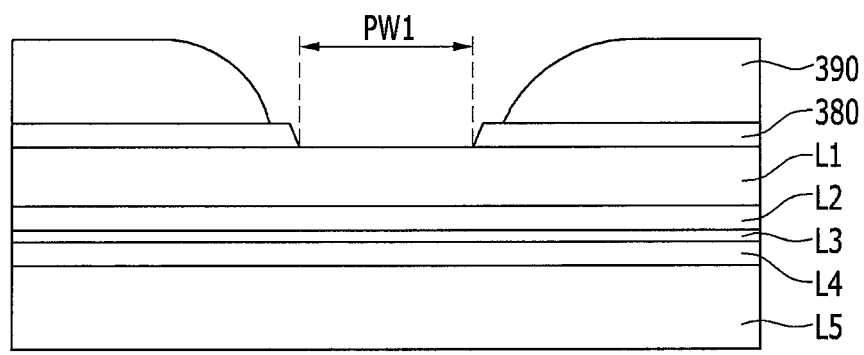
Figure 9C:
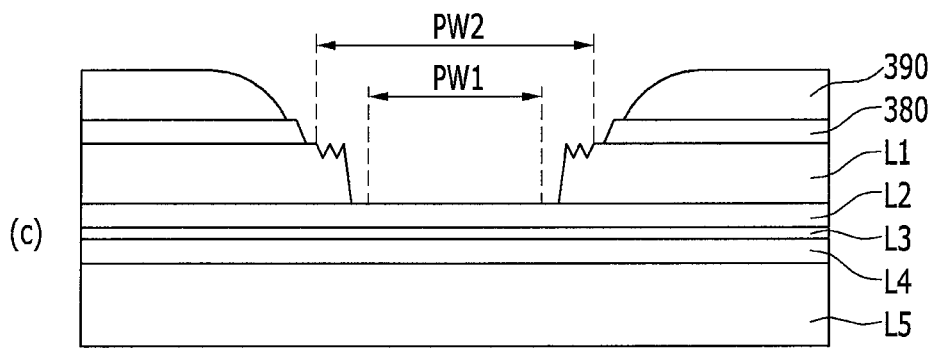
Figure 9D:
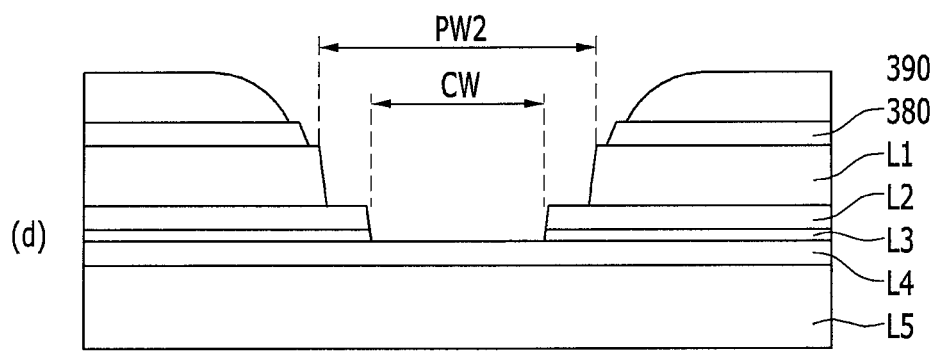

Next, as shown in FIG. 8, an electrode 400 is formed to come into contact with the semiconductor layer 320 exposed through the contact hole. Herein, the electrode 400 may be a source electrode or a drain electrode.

According to the method of manufacturing of the display device in accordance with the exemplary embodiment, it is possible to manufacture the resolution display device by forming the contact hole with the reduced width without exposing some electrodes through contact through the contact hole in the manufacturing operation of the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 310 substrate | 320 semiconductor layer |
| 330 first insulating layer | 340 first metal layer |
| 350 second insulating layer | 360 second metal layer |
| 370 third insulating layer | 380 etching buffer layer |
| 390 photosensitive film pattern | |

What is claimed is:

1. A method of manufacturing a display device comprising:
   providing a substrate;
   forming a semiconductor layer on the substrate;
   forming a first insulating layer on the semiconductor layer;
   forming a metal layer on the first insulating layer;
   forming a second insulating layer on the metal layer;
   forming an etching buffer layer on the second insulating layer;
   forming a photosensitive film pattern on the etching buffer layer; and
   etching the etching buffer layer and the first and second insulating layers to expose the semiconductor layer, wherein the etching includes:
      first etching the etching buffer layer to expose the second insulating layer, and
      second etching the first insulating layer and the second insulating layer to expose the semiconductor layer after exposing the second insulating layer, wherein a width of the second insulating layer exposed before the second etching is performed is the same as a width of the semiconductor layer after the second etching is performed.

2. The method of claim 1, wherein the etching buffer layer contains Al or ITO.

3. The method of claim 1, wherein a thickness of the etching buffer layer is in a range of about 30 nm to about 50 nm.

4. The method of claim 1, wherein the width of the exposed semiconductor layer is in a range of about 1.8 μm to about 2.1 μM.

5. The method of claim 1, wherein the first etching is performed as a wet etch.

6. The method of claim 1, wherein the second etching is performed as a dry etch.

7. The method of claim 1, further comprising:
   removing the photosensitive film pattern after the second etching.

8. The method of claim 7, further comprising:
   performing an annealing process after the removing of the photosensitive film pattern.

9. The method of claim 8, wherein a removing of the etching buffer layer is performed after the annealing process.

10. The method of claim 1, wherein a removing of the etching buffer layer is performed by using a buffered oxide etchant (BOE).

11. The method of claim 1, wherein the first insulating layer, the second insulating layer and the metal layer are alternatively formed as a plurality of layers.

12. A method of manufacturing a display device, the method comprising:
   providing a substrate;
   forming a semiconductor layer on the substrate;
   forming a first insulating layer on the semiconductor layer;
   forming a metal layer on the first insulating layer;
   forming a second insulating layer on the metal layer;
   forming an etching buffer layer on the second insulating layer;
   forming a photosensitive film pattern on the etching buffer layer;
   etching the etching buffer layer and the first and second insulating layers to expose the semiconductor layer;
   removing the photosensitive film pattern after the etching;
   performing an annealing process after the removing of the photosensitive film pattern; and removing the etching buffer layer, wherein the removing of the etching buffer layer is performed after the annealing process.

13. The method of claim 12, wherein the etching buffer layer contains Al or ITO.

14. The method of claim 12, wherein a thickness of the etching buffer layer is in a range of about 30 nm to about 50 nm.

15. The method of claim 12, wherein the etching comprises:
   first etching the etching buffer layer to expose the second insulating layer; and
   second etching the first insulating layer and the second insulating layer to expose the semiconductor layer after exposing the second insulating layer.

16. The method of claim 15, wherein a width of the second insulating layer exposed before the second etching is performed is the same as a width of the semiconductor layer after the second etching is performed.

17. The method of claim 16, wherein the width of the exposed semiconductor layer is in a range of about 1.8 μm to about 2.1 μm.

18. The method of claim 15, wherein the first etching is performed as a wet etch.

19. The method of claim 15, wherein the second etching is performed as a dry etch.

20. The method of claim 12, wherein the removing of the etching buffer layer is performed by using a buffered oxide etchant (BOE).

\* \* \* \* \*